United States Patent
Nishikawa et al.

(10) Patent No.: US 9,606,312 B2
(45) Date of Patent: Mar. 28, 2017

(54) COMPOSITE CABLE

(75) Inventors: Masako Nishikawa, Yamato (JP); Akihiro Shimotsu, Ebina (JP)

(73) Assignee: Molex, LLC, Lisle, IL (US)

( * ) Notice: Subject to any disclaimer, the term of this patent is extended or adjusted under 35 U.S.C. 154(b) by 12 days.

(21) Appl. No.: 13/984,445

(22) PCT Filed: Mar. 8, 2012

(86) PCT No.: PCT/US2012/028229
§ 371 (c)(1),
(2), (4) Date: Nov. 11, 2013

(87) PCT Pub. No.: WO2012/122354
PCT Pub. Date: Sep. 13, 2012

(65) Prior Publication Data
US 2014/0064668 A1  Mar. 6, 2014

(30) Foreign Application Priority Data
Mar. 8, 2011  (JP) .................................. 2011-049905

(51) Int. Cl.
G02B 6/42 (2006.01)
G02B 6/43 (2006.01)
(Continued)

(52) U.S. Cl.
CPC ............. *G02B 6/4293* (2013.01); *G02B 6/43* (2013.01); *H05K 1/189* (2013.01); *H05K 1/0274* (2013.01); *H05K 2201/10121* (2013.01)

(58) Field of Classification Search
USPC ........................................................ 385/77
See application file for complete search history.

(56) References Cited

U.S. PATENT DOCUMENTS 6,797,891 B1* 9/2004 Blair et al. .................... 174/268
2001/0040620 A1* 11/2001 Wakisaka et al. ............ 347/263
(Continued)

FOREIGN PATENT DOCUMENTS

JP  2008262244 A * 10/2008

OTHER PUBLICATIONS

Tomoaki et al., "Flexible Opto-Electronic Circuit Board for In-device Interconnection", IEEE 58th ECTC. May 27-30, 2008, pp. 261-267.
(Continued)

*Primary Examiner* — Kaveh C Kianni
(74) *Attorney, Agent, or Firm* — James A. O'Malley

(57) ABSTRACT

A planar optical waveguide part that includes an optical waveguide, a planar conductive wire part that includes a conductive wire, and a connecting end part formed on the lengthwise direction end part, wherein the connecting end part is provided with an optical waveguide end part formed on the lengthwise direction end part of the conductive wire part, a conductive end part formed on the lengthwise direction end part of the conductive wire part, and an intermediate plate intervening between the optical waveguide end part and the conductive end part; the optical waveguide end part, conductive end part, and intermediate plate are bonded by layering; and a bonding pad where components are bonded is formed by ultrasonic bonding to the top surface of the conductive end part.

6 Claims, 8 Drawing Sheets

(51) Int. Cl.
*H05K 1/18* (2006.01)
*H05K 1/02* (2006.01)

(56) References Cited

U.S. PATENT DOCUMENTS

| | | | |
|---|---|---|---|
| 2004/0218848 A1* | 11/2004 | Shen et al. | 385/14 |
| 2007/0194225 A1* | 8/2007 | Zorn | 250/306 |
| 2010/0195967 A1* | 8/2010 | Wang et al. | 385/129 |
| 2011/0007998 A1* | 1/2011 | Yamamoto et al. | 385/14 |
| 2011/0121922 A1* | 5/2011 | Blair et al. | 333/238 |

OTHER PUBLICATIONS

International Search Report for PCT/US2012/028229.

* cited by examiner

COMPOSITE CABLE

REFERENCE TO RELATED APPLICATIONS

The Present Disclosure claims priority to Japanese Patent Application No. 2011-049905, entitled "Composite Cable," filed on 8 Mar. 2011 with the Japanese Patent Office and PCT Application No. PCT/US2012/028229, filed on 8 Mar. 2012. The content of the aforementioned Patent Applications are fully incorporated in their entirety herein.

BACKGROUND OF THE PRESENT DISCLOSURE

The Present Disclosure relates, generally, to a composite cable.

The ability to fold a casing, in order to both decrease the size of the overall case while increasing the size of a display, is emerging as a need for conventional electronic equipment. When doing so, a signal is transmitted by equipping a conductive wire, such as a flexible printed circuit (FPC), a narrow line coaxial cable or the like, so that it passes through the inside of a hinge part where a casing and another casing are connected, with the ability to rotate. In recent years, although high speed signal transmission is required for high definition images and the like, the restriction on the internal size of the hinge has made equipping a wide or large diameter conductive wire difficult. Further, when considering grounding measures to control electromagnetic interference (EMI), the width of the conductive wire becomes even larger.

In response to this, proposals have been made to integrate an optical waveguide with excellent EMI compatibility with a conductive wire to enable a large number of signals to be transmitted. An example of this is disclosed in Japanese Patent Application No. 2008-262244, the content of which is incorporated herein in its entirety.

FIG. 9 illustrates a conventional cable in which a conductive wire is integrated with an optical waveguide. A cable 901 includes a conductive film 950 with a stacked two layer structure provided on an optical waveguide film 910. The optical waveguide film 910 is a long and thin elastic band-shaped film and includes a plurality of mutually-parallel optical waveguide cores 911. Further, the conductive film 950 is also a long and thin band-shaped film that provides flexibility, and a plurality of conductive wires 951 are formed on the upper surface.

Further, the optical waveguide film 910 and the conductive film 950 are mutually bonded by an adhesive layer 941 at the end parts on both sides in the lengthwise direction of the cable 901. The end part of cable 901 is connected onto a circuit board (not shown), and one end of the conductive wire connected to an electronic device or the like on a circuit board is connected to the conductive wire 951 of the conductive film 950. Further, the optical waveguide core 911 of the optical waveguide film 910 is optically coupled to an optical element or the like (not shown).

Note that the optical waveguide film 910 and the conductive film 950 are not mutually adhered together, but are separate at the parts other than the cable 901 end part. Therefore, the cable 901 can bend freely at the parts other than the end part and can be housed in a bent state within, for example, the casing of an electronic device and can be wound in a spiral fashion in the hinge part that connects the two casings. However, with the conventional cable 901, because the flexible optical waveguide film 910 and the conductive film 950 are layered via a pliable adhesive layer 941, the flexibility is high, making it difficult to electrically connect the components such as an IC chip, chip condenser and the like to the conductive wire 951.

In general, when electrically connecting components such as an IC chip that is susceptible to heat to a substrate or the like, instead of using reflow soldering that requires heating, a technique for ultrasonic bonding is adopted for the connection that applies an ultrasonic wave to fuse a metal bump, such as a gold bump, formed on a terminal or the like. In addition, with ultrasonic bonding, an ultrasonic horn which is a tool for transferring ultrasonic waves is pressed to a component or a terminal of a component to apply an ultrasonic wave to a metal bump.

Thus, in order to connect a component to the conductive wire 951 of the conductive film 950 by ultrasonic bonding, it ultrasonic wave is applied by pressing the ultrasonic horn to the component mounted on the conductive film 950, but because the cable 901 below the component is flexible, the ultrasonic wave can escape by passing through the flexible cable 901 even when, for example, holding the opposite side of the cable 901 against the surface of a workbench with high rigidity, and therefore, a sufficient ultrasonic wave cannot be applied to the metal bump and the component cannot be reliably connected to the conductive wire 951.

SUMMARY OF THE PRESENT DISCLOSURE

An object of the Present Disclosure, to resolve the conventional problems described above, is to provide a composite cable with a simple structure, low manufacturing cost and high reliability that can securely bond components on the top surface of a conductive wire part by bonding to the end part of the composite cable having a planar optical waveguide part, including an optical waveguide and having a planar conductive wire part, including a conductive wire by intervening an intermediate plate between the optical and the conductive wire parts.

Therefore, the composite cable according to the Present Disclosure includes a planar optical waveguide part that includes an optical waveguide, a planar conductive wire part that includes a conductive wire and a connecting end part formed on the lengthwise direction end part, wherein the connecting end part is provided with an optical waveguide end part formed on the lengthwise direction end part of the conductive wire part, a conductive end part formed on the lengthwise direction end part of the conductive wire part, and an intermediate plate intervening between the optical waveguide and the conductive end parts. The optical waveguide end part, conductive end part, and intermediate plate are bonded by layering. A bonding pad is formed by ultrasonic bonding to the top surface of the conductive end part.

A further composite cable according to the Present Disclosure, wherein on the back surface of the conductive end part, the intermediate plate opposes an area that accommodates a bonding pad where components are bonded by ultrasonic bonding. A still further composite cable, wherein the component bonded by ultrasonic bonding is an optical element where light emitted from an optical waveguide is received or where light incident to an optical waveguide exits.

A further composite cable according to the Present Disclosure, wherein the optical waveguide end part is provided with an optical path transformer, and a component bonded by ultrasonic bonding is bonded to an area that accommodates the optical path transformer on the top surface of the conductive end part, and a light transmission hole is formed in an area that accommodates the optical path transformer and the component bonded by ultrasonic bonding on the intermediate plate. A still further composite cable, wherein on the back surface of the conductive end part, the intermediate plate opposes an area that accommodates a bonding pad where components are bonded by ultrasonic bonding. A final composite cable, wherein the connector bonded to the connector bonding pad fits with another connector bonded to another member whereby the connecting end part is connected to the other member.

According to the Present Disclosure, the composite cable has an intermediate plate intervene between the optical waveguide part and the conductive wire part at the end parts of the composite cable having a planar optical waveguide part that includes an optical waveguide and having a planar conductive wire part that includes a conductive wire. By this, a component can be securely bonded by ultrasonic bonding to the top surface of the conductive wire part while also simplifying the structure, suppressing manufacturing cost, and improving reliability.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

Figure 1:
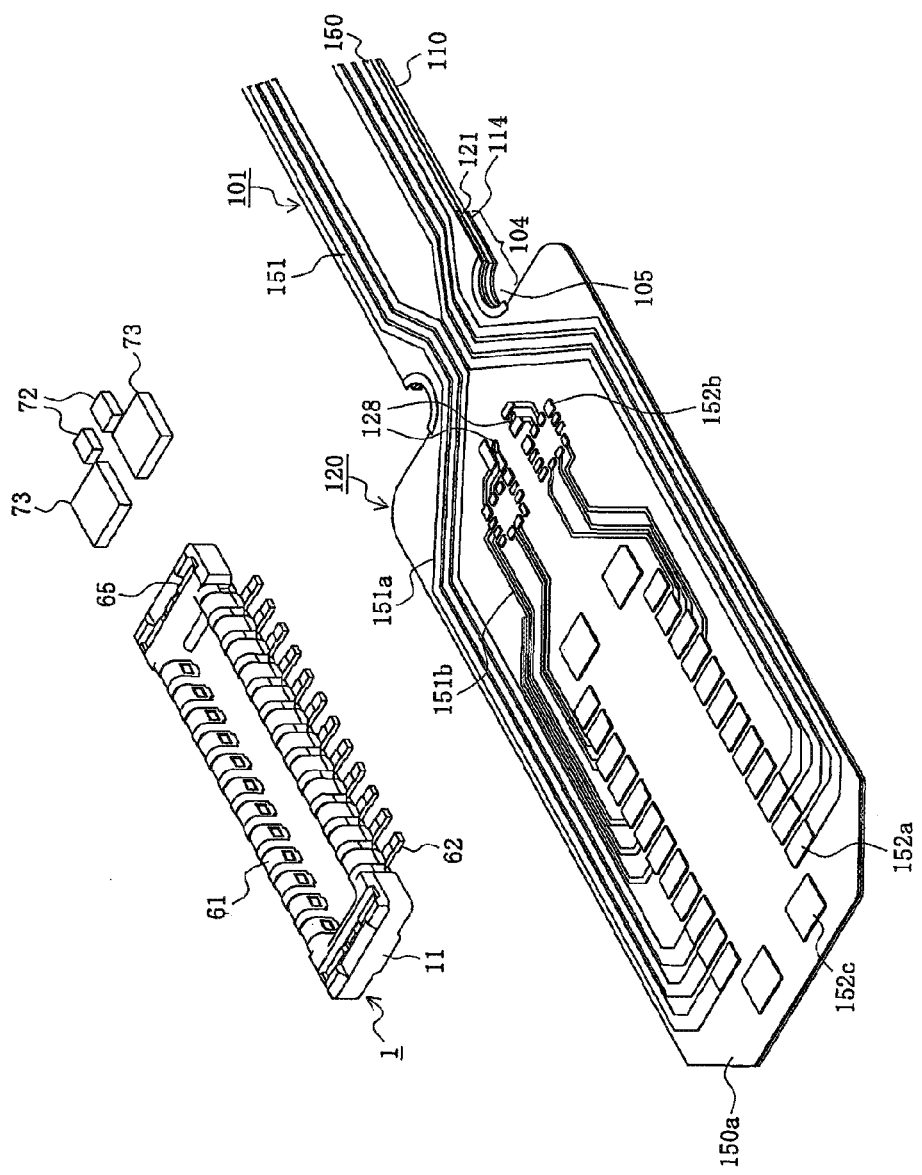
FIG. 1 is an illustration of the connecting end parts of a composite cable according to the Present Disclosure, and is a perspective view as seen from the conductive wire part side.
Figure 2:
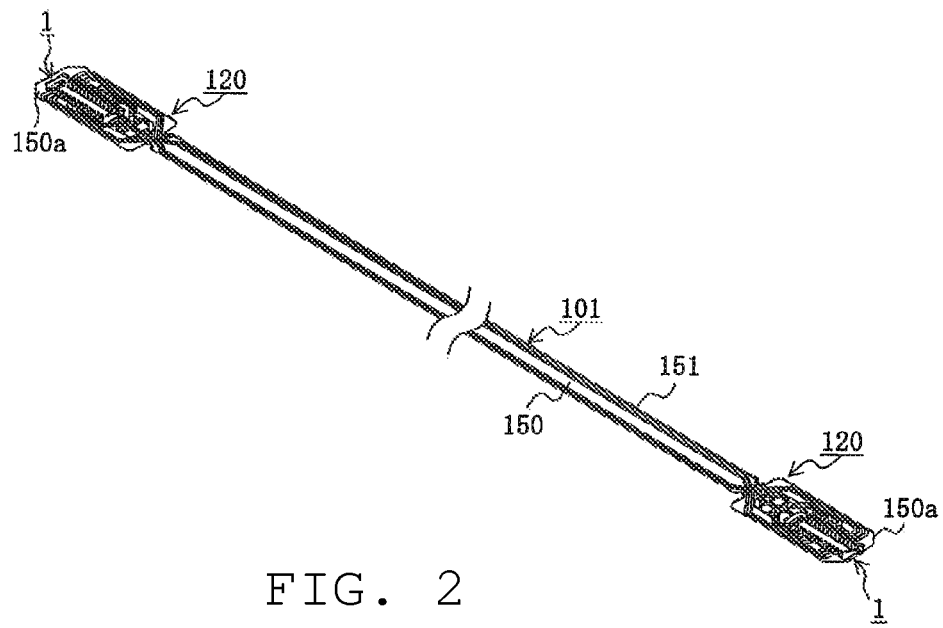
FIG. 2 is an illustration of the composite cable of FIG. 1, and is a perspective view as seen from the conductive wire part side.
Figure 3:
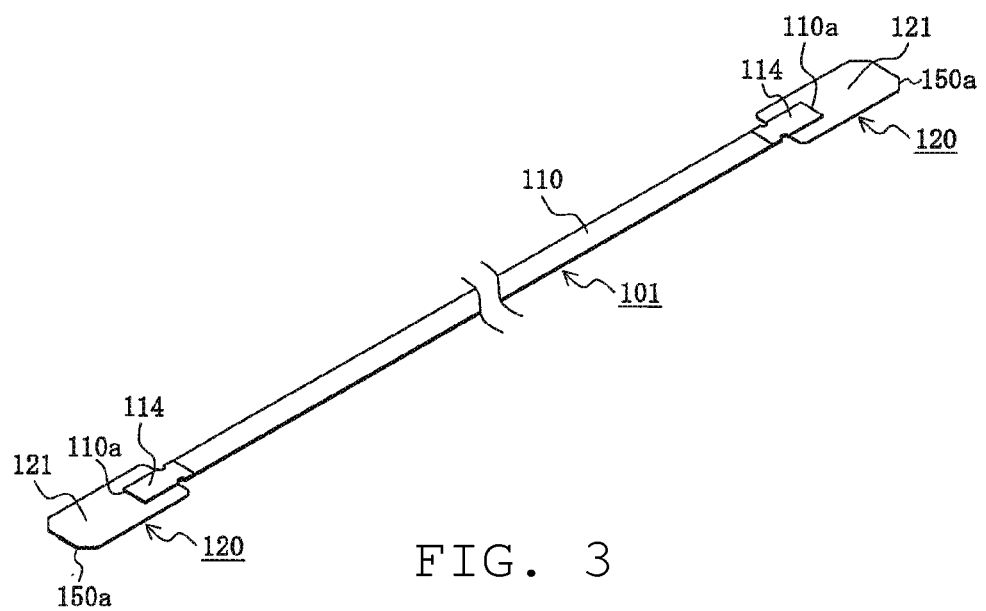
FIG. 3 is an illustration of the composite cable of FIG. 1, and is a perspective view as seen from the optical waveguide part side.

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Referring to the Figures, composite cable 101 has flexibility in coupling the optical waveguide cable 110, as an optical waveguide part that includes an optical waveguide, and a conductive cable 150, as a conductive wire part that includes the conductive wire 151. Further, connective end parts 120, formed in the lengthwise direction end part of the cable 101, connect to another member of a circuit board or the like (not illustrated). In addition, each connective end part 120 is provided with an optical waveguide end part 110a, formed on the lengthwise direction end part of the optical waveguide cable 110, and a conductive end part 150a, formed on the lengthwise direction end part of the conductive cable 150.

Also, a connector 1 is mounted by bonding to the end part 120, and fits with another connector mounted by bonding to a circuit board or the like (not illustrated), whereby the end part 120 is connected to the other member of the circuit board or the like. Note that the connector 1 and the other connector are surface-mounted on the top surface of the boards, are used for connecting the two boards and are referred to as a board-to-board connector. In addition, the connector 1 is provided with a housing 11 made of an insulating material, terminals 61 made of a conductive material and attached to the housing, and a fastening auxiliary bracket 65 made of a highly strong material and attached to the housing 11. Note that the tail part 62 of the terminal 61 extends outward from both side walls of the housing 11. The connector 1 illustrated herein is only one example, and can be freely modified. Further, connectors other than board-to-board connectors may be used, such as, a FPC (or FFC) connector, card connector, a socket for an electronic component, an electrical wire connector, an I/O connector or a back brain connector.

The cable 101 may be applied to cases in which wiring is made to pass through the inside of a hinge wherein adjacent components are linked with the ability to rotate and which have a casing that is divided into a plurality of parts and is used in electronic devices in which adjacent components are linked with the ability to rotate. Further, the cable 101 can serially transmit signals by the optical waveguide cable 110 and has excellent EMI compatibility and, therefore, is suited to uses for transmitting a large number of signals at high speed. In addition, the other connector of the connector 1 is suited to use for being mounted on the surface of a board arranged within the casing of the electronic device.

The optical waveguide cable 110 is a thin sheet member with a long and thin flexible tape shape, and with an optical waveguide extending in the lengthwise direction thereof (that is, the axis direction). The optical waveguide, described herein, has a core part 111 extending in the axis direction of the optical waveguide cable 110, can optically transmit light and has a cladding part 112 that encases the core part 111 and functions to confine the light to the core part 111.

Further, the transmission mode of the optical waveguide may be any mode such as a single mode, multimode, step index mode or the like; although herein the multimode is used. Note that the refractive index of the cladding part 112 is preferably a lower value than the refractive index of the core part 111, and are preferably made of materials in which the refractive index difference between the core part 111 and the cladding part 112 is, for example, at least 0.01. Note also that the optical waveguide is not limited to the form described herein, but may be any form that includes a core part 111 that transmits light and a cladding part 112 that confines light to the core part 111, and may be, for example, an optical waveguide created by layering or etching materials, or an optical waveguide provided with a photonics structure.

Further, the optical waveguide may be made of any type of material as long as it satisfies the conditions for this type of refractive index; it may be made of, for example, a hybrid substrate or a flexible resin film; herein, the optical waveguide will be made of a flexible resin film. Note that the optical waveguide cable 110 is made of a thin sheet member with a long and thin flexible tape shape, and therefore when adjusting the rigidity as needed, an insulating sheet may be attached to the optical waveguide cable 110. Although the description provided here is of an optical waveguide cable 110 provided with at least the core part 111 and the cladding part 112.

In addition, the conductive cable 150 is a thin sheet member with a long and thin taxable tape shape having a width thereof that is preferably substantially the same as the width of the optical waveguide cable 110. The cable 150 is, for example, a flexible printed circuit known as an FPC, provided with a first insulting layer 141 (described herein), a plurality of foil conductive wires 151 arranged in parallel at a prescribed pitch on the first insulating layer 141, which extend in the axis direction of the conductive cable 150, and a second insulating layer 142 (described herein) arranged on the conductive wires 151, and a filler layer (not shown) that exhibits electrical insulating properties to fill the space between the first insulating layer 141 and the second insulating layer 142 other than the conductive wire 151. Note that the filler layer can be appropriately omitted. Further, the conductive cable 150 does not need to be a flexible printed circuit, and may, for example, attach the conductive wire 151 directly onto the tape shaped resin film and apply the second insulating layer 142 thereon.

Note that the optical waveguide cable 110 is layered so as to oppose the opposite side surface, which is to say the back surface, of the conductive wire 151 in the conductive cable 150. Further, the optical waveguide cable 110 and the conductive cable 150 may be mutually and inseparably bonded together along the entire range in the lengthwise direction of the cable 101, or, as illustrated, only the area of the end part 120 and its vicinity are mutually and inseparably bonded with such other areas being not mutually bonded, or only a part maybe adhered. Adhering for such other areas can be appropriately selected as described above to wire the electronic device so as to not lower handling and workability at the time of working on the wires and so as to not lower the electrical and optical properties. Note the description herein is an example in which the optical waveguide cable 110 and the conductive cable 150 are made from a separable cable that does not lower the properties described above on account of differences in material properties.

Figure 4:
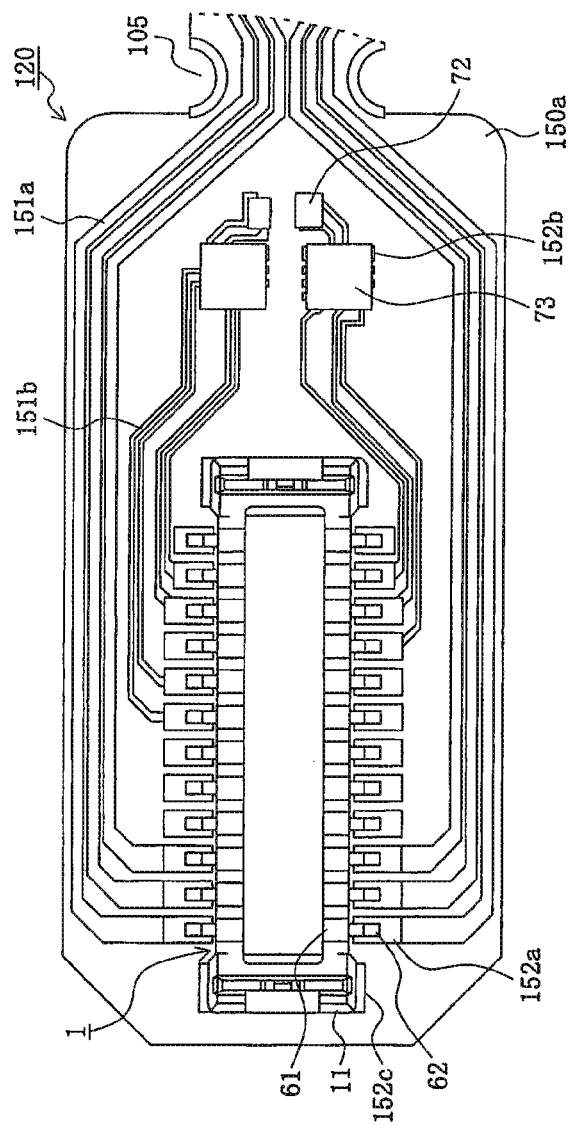
FIG. 4 is an illustration of the connecting end parts of the composite cable of FIG. 1, and is a plan view as seen from the conductive wire part side.

As illustrated in FIGS. 1 and 4, the connector 1 is added to the surface of the conductive wire 151 side (the top surface) of the conductive end part 150a at the end part 120, and components that include an optical element 72 and an IC chip 73, for driving the optical element 72, are mounted. The components are, for example, electronic or electric components. Here, components other than the optical element 72 and the IC chip 73 are omitted in the Figures for convenience. In addition, the type, quantity, arrangement and the like, of the components mounted on the end part 120 may be freely modified.

In addition, arranged on the top surface of the conductive end part 150a are a first bonding pad 152a, as a connector bonding pad with the tail part 62 of the terminal 61 of the connector 1 bonded, a second bonding pad 152b, where components such as the optical element 72, the IC chip 73 and the like are bonded, and a third bonding pad 152c, where a fastening auxiliary bracket 65 of the connector 1 is bonded. Note that the first bonding pad 152a, the second bonding pad 152b and the third bonding pad 152c are thin sheet shaped members made of a conductive material. In addition, the first bonding pad 152a, the second bonding pad 152b and the third bonding pad 152c will be described collectively herein as the bonding pad 152.

Note that a light transmission hole 128 is formed in the conductive cable 150 in a position where the optical element 72 is bonded in the vicinity of the second bonding pad 152b. Light is transmitted between the optical element 72 and the core part 111 of the optical waveguide cable 110 through the light transmission hole 128.

In this embodiment, at least one of the components of the optical element number 72 and the IC chip 73 are bonded to the second bonding pad 152b by ultrasonic bonding. Note that other components may also be connected to the second bonding pad 152b by means of reflow soldering. In this case, a metal bump 158 (described herein) is formed in advance on the top surface of the terminal part not illustrated of the optical element 72 and the IC chip 73, or the top surface of the second bonding pad 152b. In addition, the metal bump 158 is fused by the optical element 72 and the IC chip 73 is placed in a prescribed location on the top surface of the conductive end part 150a. The metal bump 158 is interposed between the terminals part of the optical element 72 and the IC chip 73 and the second bonding pad 152b, then an ultrasonic wave is applied by pressing the ultrasonic horn (not illustrated) onto the optical element 72 and the IC chip 73.

In addition, because the connector 1 and a part of the components are bonded to the bonding pad 152 by means of reflow soldering, the bonding operation for the components by ultrasonic bonding is preferably done after the bonding operation by means of reflow soldering. By this, the effect of the heat by the reflow soldering and the like can be avoided on the components that are bonded by ultrasonic bonding.

Further, arranged on the top surface of the conductive end part 150a is a first conductive wire 151a, patterned so that the conductive wire 151 contacts the first bonding pad 152a, and a second conductive wire 151b, patterned so that the first bonding pad 152a contacts the second bonding pad 152b or so the second bonding pads 152b mutually connect. Note that because the first conductive wire 151a, the second conductive wire 151b and the conductive wire 151 are generally similar, they will collectively be described as the conductive wire 151.

Because the first insulating layer 141 and the second insulating layer 142 arranged on the conductive wire 151 are thin with a high transparency and transmissivity, the conductive wire 151 can be viewed from above the conductive cable 150 as illustrated in the Figure. Note that the top surface of the bonding pad 152 is exposed and that the second insulating layer 142 does not exist on the top surface of the bonding pad 152.

In FIG. 1, 104 is a transition part that connects the wide end part in the 120 with the other portion of the narrow cable 101. A recessed part 105 is formed for position alignment with the left and right side edges of the cable 101 for the portion near to the end part 120 of the transition part 104. Therefore, the width of the cable 101 is thinnest at the portion of the recessed part 105. In addition, support film 114 is applied as a support member to the transition part 104 on the opposite side surface (the back surface) of the conductive cable 150 of the optical waveguide cable 110 and to the area from the transition part 104 to the tip end of the optical waveguide end part 110a. The support film 114 is made of a synthetic resin or any material as long as that material provides a certain degree of rigidity together with insulating properties. Note that in the example illustrated in the Figures, the tip end of the optical waveguide end part 110a does not reach the tip end of the conductive end part 150a. In other words, the optical waveguide cable 110 is shorter than the conductive cable 150 in which the tip end of the conductive end part 150a matches the tip end of the end part 120.

Further, the intermediate plate 121 is applied to the transition part 104 on the back surface of the conductive cable 150 and to the area from the transition part 104 to the tip end of the conductive end part 150a. The intermediate plate 121 is a member made of metal or of any material as long as the material is provided with a certain degree of rigidity that does not allow the ultrasonic wave to escape when bonding components to the second bonding pad 152b by ultrasonic bonding. Note that the intermediate plate 121 is in and intervened state between the conductive end part 150a and the optical waveguide end part 110a in the area in which the optical waveguide end part 110a resides.

The plurality of conductive wires 151 for the conductive end part 150a are arranged so as to respectively follow the side edge by separating to both sides in the width direction of the conductive end part 150a, to gather so as to be near the center in the width direction at the portion of the recessed part 105 and so as to respectively follow the side edge by separating to both sides in the width direction of the cable 101 at the portion closer to the center in the axis direction to the transition part 104 for the cable 101. Meanwhile, the core part 111 of the optical waveguide cable 110 is arranged to gather so as to be near the center in the width direction of the cable 101 and to extend directly in the axis direction of the cable 101 in the optical waveguide end part 110a, also in the transition part 104, and also in the portion closer to the center in the axis direction in the transition part 104 in the cable 101. Therefore, the conductive wire 151 and the core part 111 are in an overlaid state in the thickness direction of the cable 101 at the area of the recessed part 105 and particularly the transition part 104, and the conductive wire 151 and the core part 111 are arranged so as to not overlap in the portion other than the transition part 104.

In this manner, because the core part 111 and the conductive wire 151 are arranged so as to not overlap in the portion other than the transition part 104, the optical waveguide cable 110 and the conductive cable 150 are not adhered and have the ability to separate, but even when they mutually contact, or even when they are adhered and are mutually inseparable via an adhesive or the like along the entire area in the lengthwise direction of the cable 101, the flexibility of the cable 101 can be raised. Also, because the flexibility of the cable 101 is high even when the optical waveguide cable 110 and the conductive cable 150 are in mutual contact, even when they are adhered to be mutually inseparable along the entire area in the lengthwise direction of the cable 101 and even when used in an electronic device in which the casing is divided into a plurality of parts and each adjacent part is linked with the ability to rotate and is wired so as to pass through the inside of the hinge part where each of the adjacent parts are linked with the ability to rotate, retrieval is easy and the wiring work can be performed easily. In addition, it is made to be not just flexible, but because a large stress is not acting on the core part 111 and the conductive wires 151, the core part 111 and the conductive wire 1512 not received damage and the generation of optical loss in the optical waveguide cable 110 can be prevented. Meanwhile, because the transition part 104 in which the conductive wire 151 and the core part 111 are in an overlaid state in the intermediate plate 121 is intervened between the conductive cable 150 and the optical waveguide cable 110, and the support film 114 is applied to the back surface of the optical waveguide cable 110, the core part 111 and the conductive wire 151 can receive a large stress without being damaged and without the cable 101 flexing.

Figure 5:
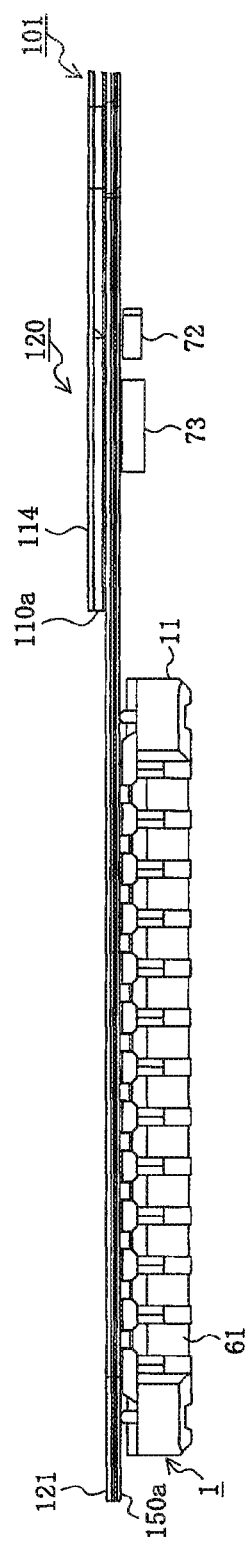
FIG. 5 is a side view of the connecting end parts of the composite cable of FIG. 1.

FIGS. 5-8 illustrate the structure in the end part 120 of the cable 101. In these Figures, the tip end of the optical waveguide end part 110a does not reach the tip end of the conductive end part 150a, but may be made to reach the tip end of the conductive end part 150a. In other words, the length of the conductive cable 150 may be the same as the length of the apical waveguide cable 110. Note that even when the tip end of the optical waveguide end part 110a does not reach the tip end of the conductive end part 150a, it is preferable that the tip end of the optical waveguide end part 110a exceeds the position of the optical element 72 in relation to the axis direction, as illustrated in FIG. 5, to reach the vicinity of the position of the connector 1, which is to say, the area between the connector 1 and the components.

Figure 6:
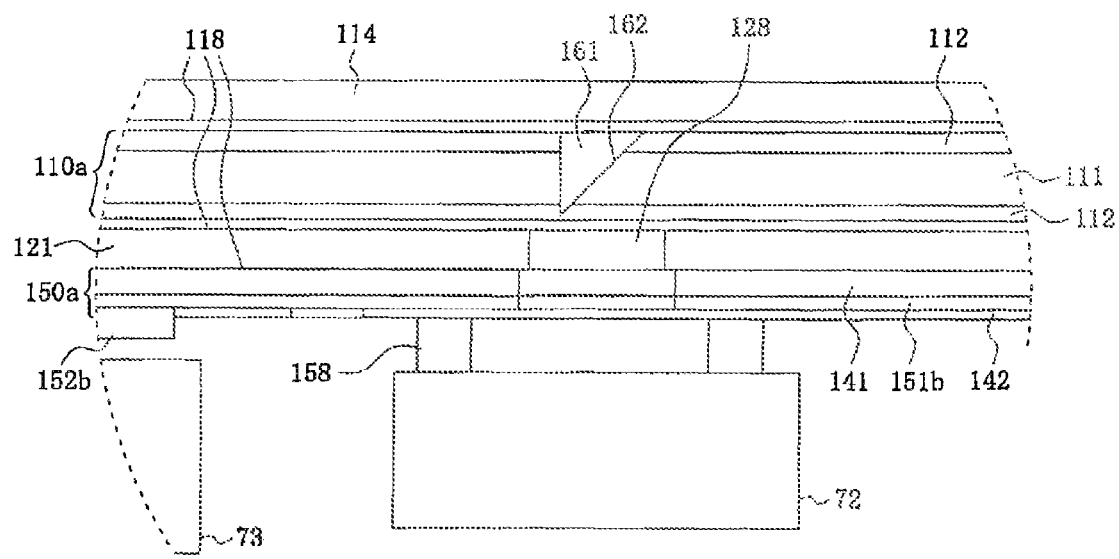
FIG. 6 is an essential part magnified side cross-sectional view illustrating a layering structure of the connecting end parts of FIG. 5.

In addition, the end part 120 has a layered structure such as that illustrated in FIG. 6 in the area at least where components bonded to the second bonding pad 152b are positioned. In other words, the intermediate plate 121 intervenes between the conductive end part 150a and the optical waveguide end part 110a. Further, the support film 114 is applied to the back surface of the optical waveguide end part 110a. When described in more detail, the support film 114, the adhesive layer 118, the optical waveguide end part 110a, the adhesive layer 118, the intermediate plate 121, the adhesive layer 118, the conductive end part 150a are layered in that order along the top surface side (from top to bottom in FIG. 6) of the conductive end part 150a from the back surface side of the optical waveguide end part 110a. Note that the optical waveguide end part 110a, similar to the other portion of the optical waveguide cable 110, is provided with a cladding part 112 that confines the light to the core part 111 and the core part 111 that transmits light, and the conductive end part 150a, similar to the other portion of the conductive cable 150, is provided with a first insulating layer 141, a conductive wire 151 provided on the first insulating layer 141, and a second insulating layer 142 provided on the conductive wire 151.

Note that in the example illustrated in FIG. 6, the optical element 72 is bonded to the second bonding pad 152b by ultrasonic bonding. In this case, the metal bump 158, such as a gold bump formed in advance, is bonded by applying an ultrasonic wave to the top surface of the element part (not illustrated) of the optical element 72 or to the top surface of the second bonding pad 152b, and the element part of the optical element 72 is electrically and physically connected to the second bonding pad 152*b*. In addition, an optical path transformer 161 is formed as an optical connecting part in the optical waveguide end part 110*a*. The optical path transformer 161 is provided with an inclined surface 162 that functions as a mirror surface, and the orientation of light transmitted by the core part 111 is transformed to a substantially right angle. In other words, the light path of the axis wire direction of the cable 101 is converted to a light path in the perpendicular direction to the top surface of the cable 101. By this, the light transmitted by the core part 111 of the optical waveguide cable 110 can be exited downward from the top surface (bottom surface in FIG. 6) of the cable 101 while the light incident to the top surface of the cable 101 from the lower direction can be guided to the core part 111. The optical path transformer 161 is formed in an area so as to accommodate the optical element 72 mounted on the top surface of the conductive end part 150*a* of the cable 101. In other words, in FIG. 6, the optical path transformer 161 is positioned directly above the optical element 72 connected to the second bonding pad 152*b* in relation to the axis direction of the conductive end part 150*a*. Note that it is positioned directly over the optical element 72 even in relation to the width direction of the conductive end part 150*a*. By this, the optical waveguide end part 110*a* and the optical element 72 enter into an optically connected state.

In other words, the light that exited from the light emitting surface of the optical element 72 enters into the cable 101 from below and is reflected by the inclined surface 162 of the optical path transformer 161, and the orientation is changed to a substantial right angle, and is guided to the corresponding core part 111 where it is transmitted within the core part 111 along the axis direction of the cable 101. Meanwhile, the light transmitted within the core part 111 along the axis direction of the cable 101 is reflected by the inclined surface 162 of the optical path transformer 161, and the orientation is changed to a substantial right angle, where it exits downward from the cable 101 and is received by the light receiving surface of the optical element 72. Note that because the intermediate plate 121 resides between the optical path transformer 161 and the optical element 72, in that state, the light is shielded and is not transmitted. Similarly, the conductive cable 150 resides between the optical path transformer 161 and the optical element 72, and when the first insulating layer 141 and the second insulating layer 142 is used in which light is difficult to penetrate, the light is shielded and is not transmitted.

Therefore, in the embodiment illustrated in FIG. 6, the small diameter light transmission hole 128 is formed in the intermediate plate 121 and the conductive cable 150 thereby transmission of the light can occur between the optical path transformer 161 and the optical element 72. As illustrated in FIG. 6, the light transmission hole 128 is formed so as to be in a position directly above the optical element 72 in relation to the axis direction and also in relation to the width direction of the end part 120 of the cable 101.

The light transmission hole 128 is transparent so there is no need to form a member for light transmission. Therefore, in the example illustrated in FIG. 6, the light transmission hole 128 is neither formed in the second insulating layer 142 nor in the adhesive layer 118 between the optical waveguide end part 110*a* and the intermediate plate 121 of the conductive cable 150. This is because, as explained above, the second insulating layer 124 is thin with high transparency. Similarly, this is also because the adhesive layer 118 is thin with a high transparency and transmissivity. In contrast to this, because the intermediate plate 121 is a plate material made of metal, light does not penetrate, and similarly, the first insulting layer 141 of the conductive cable 150 is also a member in which light is not transmitted. Thus, the light transmission hole 128 is formed respectively in the intermediate plate 121 and the first insulating layer 141 in the thickness direction by means of, for example, laser machining, etching or the like. Note that when the transparency and transmissivity of the first insulating layer 141 is similarly high as that of the second insulating layer 142, the light transmission hole 128 may not be formed in the first insulating layer 141.

Figure 7:
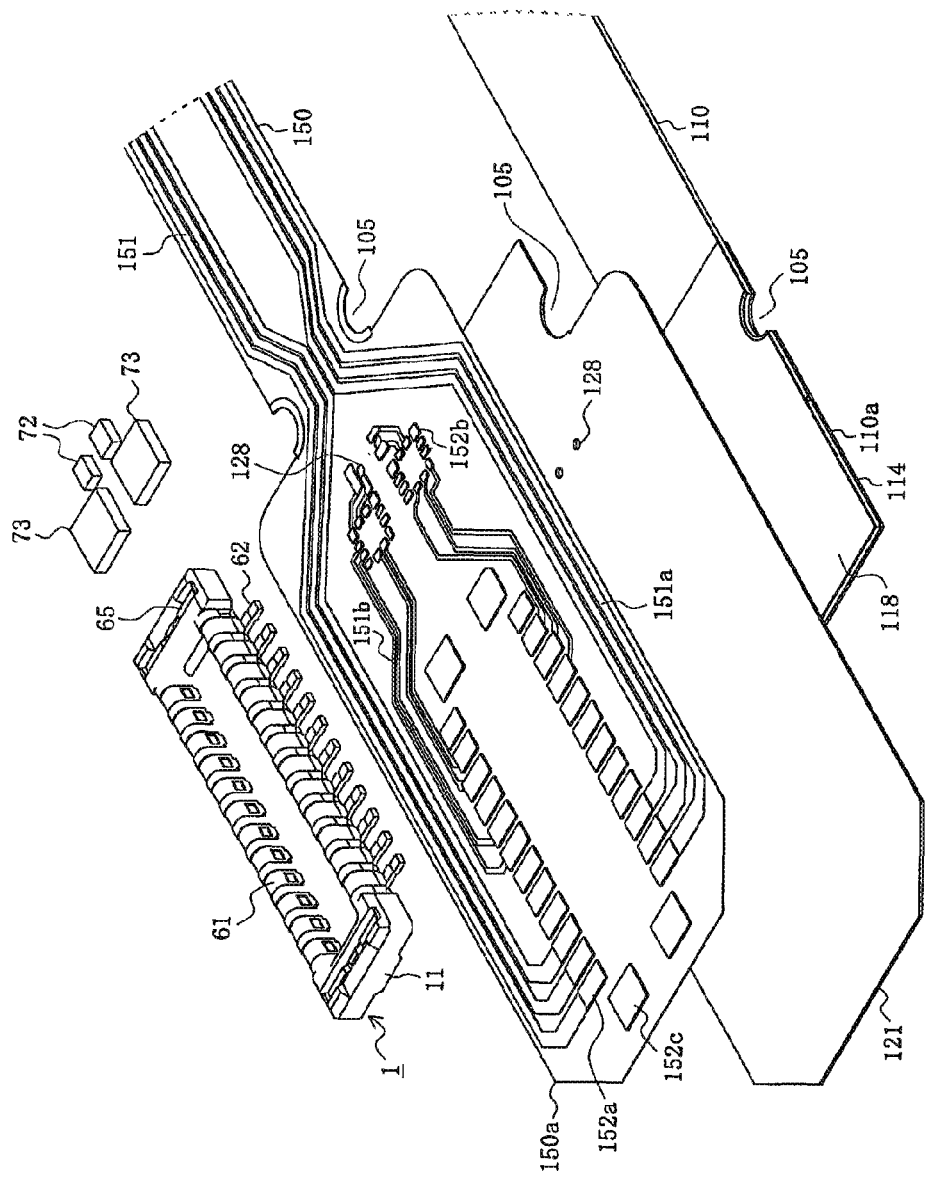
FIG. 7 is an expanded view illustrating the connecting end parts of FIG. 5.
Figure 8:
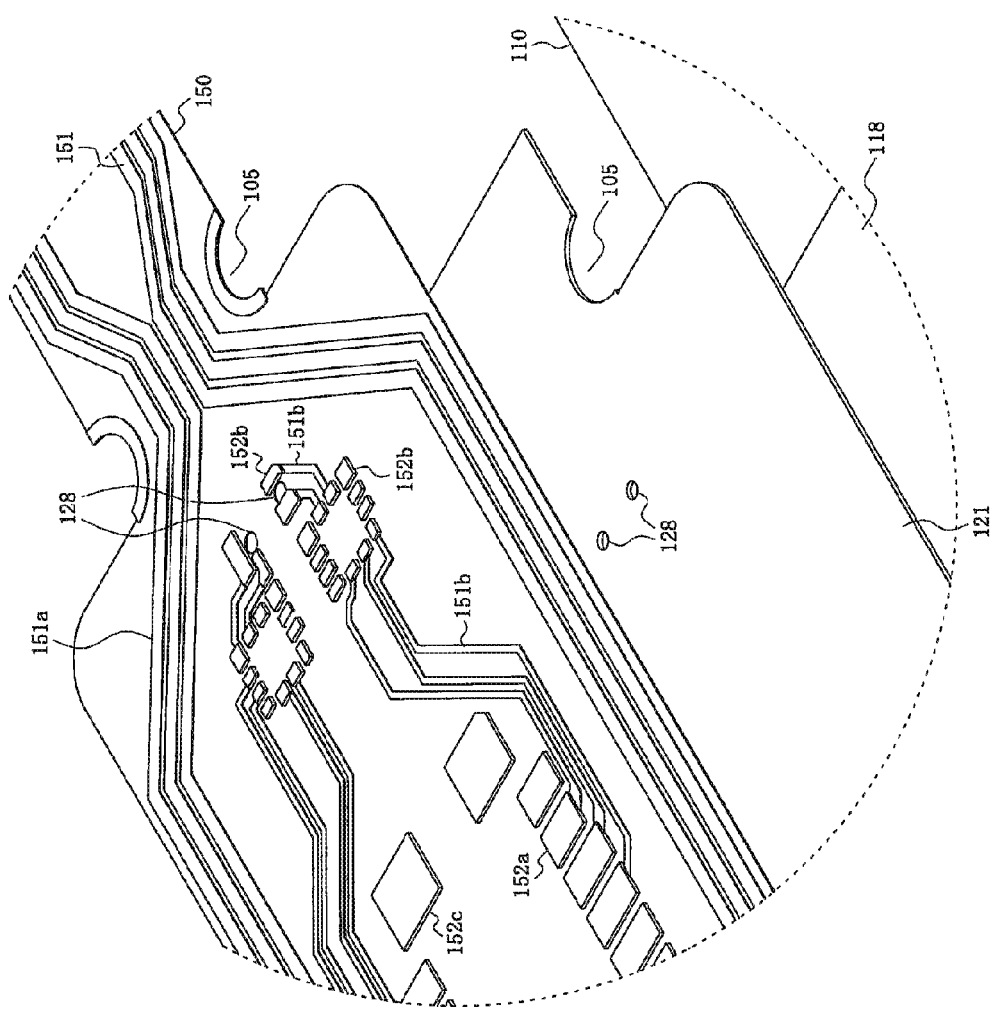
FIG. 8 is an expanded view illustrating a layering structure of the connecting end parts of the composite cable of FIG. 1, and is an essential part magnified view of FIG. 7.
Figure 9:
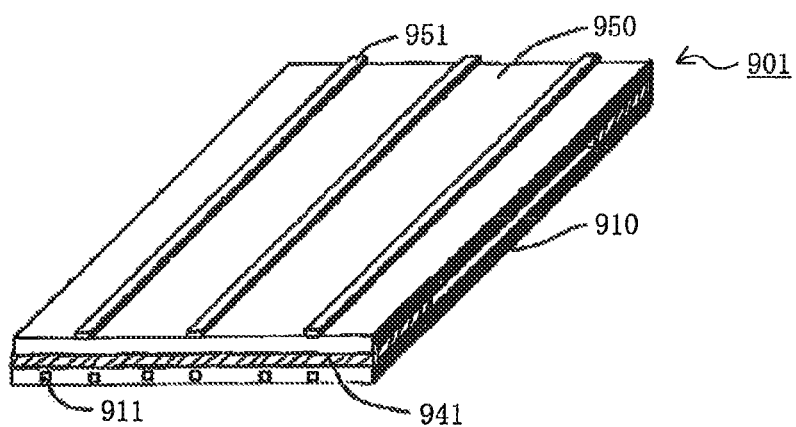
FIG. 9 illustrates a conventional cable.

Further, as illustrated in FIG. 7, the recessed part 105 is formed respectively in the optical waveguide cable 110, the intermediate plate 121, and in an area corresponding to the transition part 104 of the conductive cable 150. Therefore, in the work operation for layering and bonding the optical waveguide cable 110, the intermediate plate 121, and the conductive cable 150, the recessed part 105 is engaged with a pair of cylindrically shaped guide members so as to slide so that the optical waveguide cable 110, the intermediate plate 121, and the conductive cable 150 can be respectively moved, and thus the positions of the optical waveguide cable 110, the intermediate plate 121 and the conductive cable 150 can be easily and accurately aligned.

In addition, the end part 121 is connected to the other member by being placed opposite the fitting surface of the other connector on which a fitting surface (bottom side surface in FIG. 5) of the connector 1 is mounted and bonded on to the top surface of the other member of a circuit board or the like (not illustrated), then the connecting 1 is fit with the other connector. In this case, the top surface of the other member and the top surface of the end part 120 (bottom side surface in FIG. 5) are mutually opposing.

By this, the electric signal transmitted through the conductive wire 151 of the conductive cable 150 is transmitted to the other member the other connector 1 and the other connector. Conversely, the electric signal from the other member can be transmitted to the conductive wire 151 of the conductive cable 150 via the other connector and the connector 1. Further, the optical signal transmitted through the core part 111 of the optical waveguide cable 110 is converted to electric signal by the optical element 72, the IC chip 73 or the like, and afterwards, is transmitted to the other member via the connector 1 and the other connector. Conversely, the electric signal from the other member is transmitted to the end part 121 via the other connector and the connector 1 and is converted to an optical signal by the optical element 72, the IC chip 73 or the like, and afterwards, is transmitted through the core part 111 of the optical waveguide cable 110. Note that because the intermediate plate 121, which is made of metal, also functions as a cladding plate, the cable 101 can be suited also to high-frequency transmission.

In this manner, the cable 101 in this embodiment has a planar optical waveguide cable 110 that includes an optical waveguide, a planar conductive cable 150 that includes a conductive wire 151, and an end part 120 formed on the end part in the lengthwise direction. The end part 120 is provided with an optical waveguide end part 110*a* formed on the end part in the lengthwise direction of the optical waveguide cable 110, a conductive end part 150*a* formed on the end part in the lengthwise direction of the conductive cable 150, and an intermediate plate 121 that intervenes between the optical waveguide end part 110*a* and the conductive end part 150*a*. The optical waveguide end part 110*a*, the conductive end part 150*a*, and the intermediate plate 121 are bonded by layering, and a bonding pad 152 is formed where components are bonded by ultrasonic bonding to the top surface of the conductive end part 150a.

By this, when ultrasonic wave is applied by pressing the ultrasonic horn to a component placed on the top surface of the conductive end part 151a in a state in which the optical waveguide end part 110a on the back surface of the end part 120 is abutted against a workbench or the like, because the intermediate plate 121 is intervened between the optical waveguide end part 110a and the conductive end part 150a, the component can be securely bonded to the bonding pad 152 without the ultrasonic wave escaping. In addition, the structure can be simplified, the manufacturing cost can be suppressed and the reliability can be improved.

Further, on the back surface of the conductive end part 150a, the intermediate plate 121 opposes an area that accommodates the bonding pad 152 where components are bonded by ultrasonic bonding. In this manner, because the intermediate plate 121 is bonded directly beneath (the back surface of), the conductive end part 150a of an area corresponds to the bonding pad 152, preventing the ultrasonic wave from escaping can be more effectively prevented, and thus components can be securely bonded by the bonding pad 152.

In addition, the optical element 72, bonded by ultrasonic bonding, where light emitted from an optical waveguide is received or where light incident to an optical waveguide exits. By this, heat effects to the optical element 72 due to soldering can be prevented.

In addition, the optical waveguide end part 110a is provided with an optical path transformer 161, and a component bonded by ultrasonic bonding is bonded to an area that accommodates the optical path transformer 161 on the top surface of the conductive end part 150a, and a light transmission hole 128 is formed in an area that accommodates the optical path transformer 161 and the component bonded by ultrasonic bonding on the intermediate plate 121. By this, because the material property of the intermediate plate 121 can be appropriately selected for material properties with high rigidity but that do not transmit light, preventing the ultrasonic wave from escaping can be more effectively prevented by increasing the rigidity of the intermediate plate 121, and components can be more securely bonded to the bonding pad 152.

In addition, the first bonding pad 152a on which the connector 1 is bonded is further formed on the top surface of the conductive end part 150a. By this, the connector 1 can be mounted by bonding to the top surface of the conductive end part 150a by reflow soldering prior to components being bonded by ultrasonic bonding.

In addition, by fitting the connector 1 bonded to the first bonding pad 152a with the other connector bonded to the other member, the end part 120 is connected with the other member. By this, by the simple operation fitting the connector 1 with the other connector, the cable 101 can be connected with the other member of the circuit board or the like.

While a preferred embodiment of the Present Disclosure is shown and described, it is envisioned that those skilled in the art may devise various modifications without departing from the spirit and scope of the foregoing Description and the appended Claims.

What is claimed is:

1. A composite cable, comprising:
    a planar optical waveguide part that includes an optical waveguide, a planar conductive wire part that includes a conductive wire, and a connecting end part formed on a lengthwise direction end part of the planar optical waveguide part, wherein
    the connecting end part is provided with an optical waveguide end part formed on a lengthwise direction end part of the planar optical waveguide part, a conductive end part formed on a lengthwise direction end part of the conductive wire part, and an intermediate plate intervening between the optical waveguide end part and the conductive end part the intermediate plate configured to add rigidity to the end parts;
    the optical waveguide end part, conductive end part, and intermediate plate are bonded by layering;
    a bonding pad, formed on the top surface of the conductive end part, where a component is bonded; and
    a connector bonding pad formed on the top surface of the conductive end part, where a connector is bonded.

2. The composite cable according to claim 1, wherein on the back surface of the conductive end part, the intermediate plate opposes an area that accommodates the bonding pad where the component is bonded by ultrasonic bonding.

3. The composite cable according to claim 1, wherein the component bonded by ultrasonic bonding is an optical element where light emitted from an optical waveguide is received or where light incident to an optical waveguide exits.

4. The composite cable according to claim 1, wherein the optical waveguide end part is provided with an optical path transformer, and a component bonded by ultrasonic bonding is bonded to an area that accommodates the optical path transformer on the top surface of the conductive end part, and a light transmission hole is formed in an area that accommodates the optical path transformer and the component bonded by ultrasonic bonding on the intermediate plate.

5. The composite cable according to claim 1, wherein the connector bonded to the connector bonding pad fits with another connector bonded to another member whereby the connecting end part is connected to the other member.

6. The composite cable according to claim 1, wherein the intermediate plate is made from metal.

* * * * *